United States Patent
Nakagawa et al.

(10) Patent No.: US 6,562,710 B2
(45) Date of Patent: May 13, 2003

(54) SEMICONDUCTOR DEVICE AND METHOD FOR FABRICATING THE SAME

(75) Inventors: Hideo Nakagawa, Omiachiman (JP); Reiko Hinogami, Hirakata (JP); Eiji Tamaoka, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/971,734

(22) Filed: Oct. 9, 2001

(65) Prior Publication Data

US 2002/0048928 A1 Apr. 25, 2002

(30) Foreign Application Priority Data

Oct. 20, 2000 (JP) ........................... 2000-320351

(51) Int. Cl.⁷ .......................... H01L 21/4763
(52) U.S. Cl. ................. 438/619; 438/622; 438/623; 438/624; 438/625; 438/626; 438/627; 438/628; 438/629; 438/637
(58) Field of Search .................. 438/618, 619, 438/622, 623, 624, 625, 626, 627, 628, 629, 637

(56) References Cited

U.S. PATENT DOCUMENTS

2002/0050651 A1 * 5/2002 Nakagawa et al.
2002/0060354 A1 * 5/2002 Nakagawa et al.

* cited by examiner

Primary Examiner—Long Pham
(74) Attorney, Agent, or Firm—Nixon Peabody LLP; Donald R. Studebaker

(57) ABSTRACT

After depositing a metal film on an insulating film on a semiconductor substrate, a first interlayer insulating film is formed on the metal film. After forming first plug openings in the first interlayer insulating film by etching the first interlayer insulating film with a first mask pattern used as a mask, first connection plugs are formed by filling a first conducting film in the first plug openings. A second interlayer insulating film is formed on the first interlayer insulating film. After forming second plug openings respectively on the first connection plugs in the second interlayer insulating film by etching the second interlayer insulating film with a second mask pattern used as a mask, second connection plugs are formed by filling a second conducting film in the second plug openings. The metal film is etched by using at least the first connection plugs and the second connection plugs as a mask so as to form metal interconnects, and then, a third interlayer insulating film is formed on the metal interconnects so as to form an air gap between the metal interconnects.

4 Claims, 15 Drawing Sheets

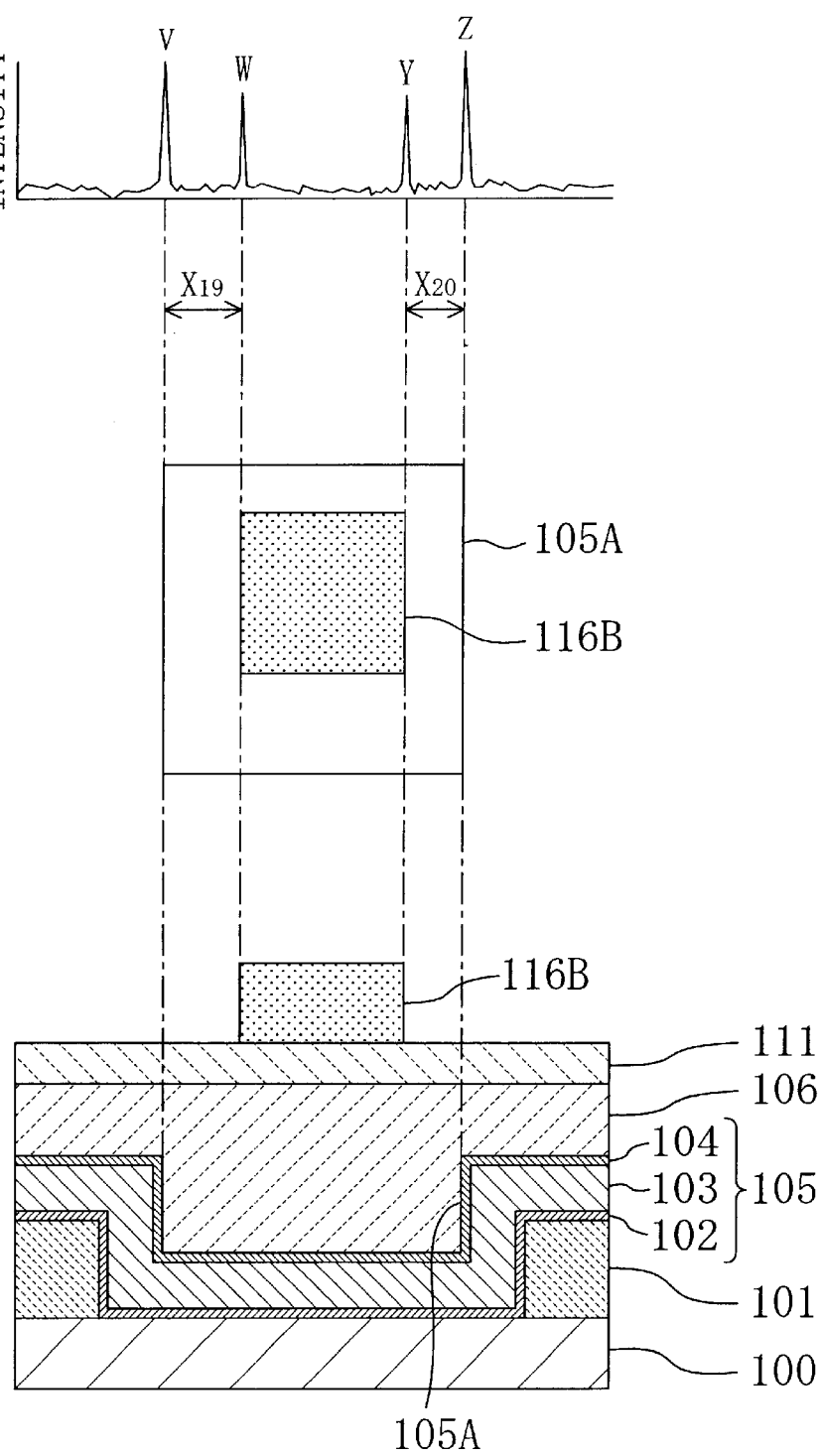

SEMICONDUCTOR DEVICE AND METHOD FOR FABRICATING THE SAME

BACKGROUND OF THE INVENTION

The present invention relates to a semiconductor device having an air gap between metal interconnects and a method for fabricating the same.

A conventional semiconductor device having an air gap between metal interconnects and a method for fabricating the same will now be described with reference to FIGS. 12A through 12D, 13A through 13C, 14A through 14C and 15A through 15C.

First, as shown in FIG. 12A, an insulating film 11 of an insulating material is formed on a semiconductor substrate 10 by known chemical vapor deposition (CVD) or spin coating, and then, connection plugs (not shown) are formed in the insulating film 11.

Next, as shown in FIG. 12B, a first barrier metal layer 12, a metal film 13 and a second barrier metal layer 14 are successively deposited on the insulating film 11, thereby forming an interconnect multi-layer film 15. The first barrier metal layer 12 and the second barrier metal layer 14 are formed by known sputtering, and the metal film 13 is formed by known sputtering, CVD or plating.

Then, as shown in FIG. 12C, a first interlayer insulating film 16 of an insulating material is formed on the interconnect multi-layer film 15 by the known CVD or spin coating, and a first resist pattern 17 is then formed on the first interlayer insulating film 16 by known lithography.

Subsequently, the first interlayer insulating film 16 is etched by using the first resist pattern 17 as a mask, thereby forming plug openings 18 in the first interlayer insulating film 16 as shown in FIG. 12D.

Next, as shown in FIG. 13A, a conducting film 19 is deposited on the first interlayer insulating film 16 by the sputtering, CVD or plating so as to fill the plug openings 18. In this case, when the plug opening 18 has an aspect ratio (a ratio of the thickness of the first interlayer insulating film to the diameter of the plug opening 18) larger than approximately 4, a void (space) 20 is formed in the conducting film 19 within the plug opening 18.

Then, as shown in FIG. 13B, a portion of the conducting film 19 present on the first interlayer insulating film 16 is removed by chemical mechanical polishing (CMP), thereby forming connection plugs 21 from the conducting film 19.

Thereafter, as shown in FIG. 13C, the first interlayer insulating film 16 is selectively dry etched, thereby reducing the thickness of the first interlayer insulating film 16. Thus, the connection plugs 21 protrude from the first interlayer insulating film 16.

Next, as shown in FIG. 14A, a second resist pattern 22 is formed on the first interlayer insulating film 16, and the first interlayer insulating film 16 is then etched by using the second resist pattern 22 as a mask, thereby forming a patterned first interlayer insulating film 16A as shown in FIG. 14B.

Then, the interconnect multi-layer film 15 composed of the first barrier metal layer 12, the metal film 13, the second barrier metal layer 14 is dry etched by using the second resist pattern 22, the patterned first interlayer insulating film 16A and the connection plugs 21 as a mask. Thus, lower metal interconnects 15A are formed from the interconnect multi-layer film 15 as shown in FIG. 14C.

The second resist pattern 22 is removed by ashing before or after the dry etching of the interconnect multi-layer film 15. In the case where the second resist pattern 22 is removed before the dry etching of the interconnect multi-layer film 15, an upper portion of each connection plug 21 is etched at the initial stage of the dry etching of the interconnect multi-layer film 15, and hence, an upper portion of each void 20 is opened so as to form an opening 20a as shown in FIG. 14C. Alternatively, in the case where the second resist pattern 22 is removed after the dry etching of the interconnect multi-layer film 15, the upper portion of each connection plug 21 is etched in the middle of the dry etching of the interconnect multi-layer film 15, and hence, the upper portion of each void 20 is opened so as to form the opening 20a as shown in FIG. 14C also in this case.

Next, the patterned first interlayer insulating film 16A and the insulating film 11 are etched. Thus, the thickness of the patterned first interlayer insulating film 16A is reduced and the thickness of a portion of the insulating film 11 not covered with the lower metal interconnects 15A is reduced as shown in FIG. 15A. During this etching, the upper portions of the connection plugs 21 are also etched, and hence, the openings 20a of the voids 20 are enlarged as shown in FIG. 15A.

Then, as shown in FIG. 15B, a second interlayer insulating film 23 is deposited over the semiconductor substrate by the CVD, thereby forming air gaps 24 in the second interlayer insulating film 23 between the lower metal interconnects 15A.

Subsequently, as shown in FIG. 15C, the second interlayer insulating film 23 is planarized by the CMP. Thus, a metal interconnect structure having the air gaps 24 is obtained.

Thereafter, a series of processes described above (from the procedure of FIG. 12B to the procedure of FIG. 15C) are repeatedly carried out, so that a multi-layer interconnect structure having an air gap can be obtained.

In the conventional method, when the aspect ratio of the plug openings 18 exceeds approximately 4, the voids 20 are formed within the connection plugs 21 as shown in FIG. 13A. Therefore, when the lower metal interconnects 15A having the air gaps 24 are formed, the complete openings 20a of the voids 20 are formed in the connection plugs 21 as shown in FIG. 15C.

Accordingly, the electric resistance between an upper metal interconnect formed on the second interlayer insulating film 23 and the connection plug 21 is largely increased, resulting in causing a problem that the characteristic of the device is degraded.

In this case, when the electric resistance between the upper metal interconnect and the connection plug 21 is larger beyond the limit, the reliability of the metal interconnect structure is largely lowered, and the semiconductor device cannot be operated in the worst case.

Furthermore, in the procedure for planarizing the second interlayer insulating film 23 by the CMP, an abrasive used in the CMP enters the voids 20, so as to cause a problem that the connection plugs 21 are corroded by the abrasive.

SUMMARY OF THE INVENTION

In consideration of the aforementioned conventional problems, an object of the invention is fabricating a high performance and highly reliable semiconductor device having an air gap between metal interconnects by preventing formation of a void in a connection plug during the fabrication thereof.

In order to achieve the object, the method for fabricating a semiconductor device of this invention comprises a first step of depositing a metal film on an insulating film on a semiconductor substrate; a second step of forming a first mask pattern on a first interlayer insulating film formed on the metal film and forming first plug openings in the first interlayer insulating film by etching the first interlayer insulating film with the first mask pattern used as a mask; a third step of forming first connection plugs by filling a first conducting film in the first plug openings; a fourth step of forming a second mask pattern on a second interlayer insulating film formed on the first interlayer insulating film and forming second plug openings respectively on the first connection plugs in the second interlayer insulating film by etching the second interlayer insulating film with the second mask pattern used as a mask; a fifth step of forming second connection plugs by filling a second conducting film in the second plug openings; a sixth step of forming the metal film into metal interconnects by etching the metal film with at least the first connection plugs and the second connection plugs used as a mask; and a seventh step of forming a third interlayer insulating film on the metal interconnects so as to form an air gap between the metal interconnects.

In the method for fabricating a semiconductor device of this invention, after forming the first plug openings in the first interlayer insulating film formed on the metal film, the first connection plugs are formed by filling the first conducting film in the first plug openings, and after forming the second plug openings respectively on the first connection plugs in the second interlayer insulating film formed on the first interlayer insulating film, the second connection plugs are formed by filling the second conducting film in the second plug openings. Therefore, the thickness of the first interlayer insulating film can be set to such a value that no void is formed in the first connection plugs, and the thickness of the second interlayer insulating film can be set to such a value that no void is formed in the second connection plugs. Accordingly, the semiconductor device having the air gap between the metal interconnects can be fabricated without forming voids in multi-layer connection plugs each composed of the first connection plug and the second connection plug.

The method for fabricating a semiconductor device preferably further comprises a step of forming multi-layer metal interconnects on the third interlayer insulating film by repeatedly carrying out procedures from the first step to the seventh step.

Thus, a semiconductor device with a multi-layer interconnect structure having air gap between metal interconnects can be fabricated without forming a void in connection plugs.

In the method for fabricating a semiconductor device, the first mask pattern preferably has an alignment accuracy measuring mark with a thickness not penetrated in etching for forming the first plug openings.

Thus, in an alignment mark region of the first interlayer insulating film, no recess is formed and hence the first conducting film is not filled, and therefore, a mistake in detecting a signal peak can be avoided in alignment accuracy measurement of the second mask pattern. As a result, the alignment can be highly accurately measured.

In the method for fabricating a semiconductor device, the second mask pattern preferably has an alignment accuracy measuring mark with a thickness not penetrated in etching for forming the second plug openings.

Thus, in an alignment mark region of the second interlayer insulating film, no recess is formed and hence the second conducting film is not filled, and therefore, a mistake in detecting a signal peak can be avoided in alignment accuracy measurement subsequently carried out. As a result, the alignment can be highly accurately measured.

The semiconductor device of this invention comprises metal interconnects formed on an insulating film on a semiconductor substrate; an interlayer insulating film formed on the metal interconnects; first connection plugs respectively connected to the metal interconnects and made from a first conducting film filled in first plug openings formed in the interlayer insulating film; second connection plugs respectively connected to upper faces of the first connection plugs and made from a second conducting film filled in second plug openings formed in the interlayer insulating film; and an air gap formed between the metal interconnects in the interlayer insulating film.

In the semiconductor device of this invention, the thickness of the first interlayer insulating film can be set to such a value that no void is formed in the first connection plugs and the thickness of the second interlayer insulating film can be set to such a value that no void is formed in the second connection plugs. Accordingly, a multi-layer connection plug composed of the first connection plug and the second connection plug can be prevented from having a void therein.

BRIEF DESCRIPTION OF THE DRAWINGS

FIG. 6A is a diagram of a measurement signal obtained through measurement using an alignment accuracy measuring apparatus based on an optical sizer by observing an alignment mark region from above in the vertical direction, FIG. 6B is a plan view of the alignment mark region and FIG. 6C is a cross-sectional view of the alignment mark region for showing the cross-sectional structure taken along line X—X of FIG. 6B;

FIG. 7A is a diagram of a measurement signal obtained through the measurement using the alignment accuracy measuring apparatus based on an optical sizer by observing the alignment mark region from above in the vertical direction and FIG. 7B is a cross-sectional view of the alignment mark region;

FIG. 8A is a diagram of a measurement signal obtained through the measurement using the alignment accuracy measuring apparatus based on an optical sizer by observing the alignment mark region from above in the vertical direction, FIG. 8B is a plan view of the alignment mark region and FIG. 8C is a cross-sectional view of the alignment mark region;

FIGS. 11A, 11B and 11C are cross-sectional views for showing still other procedures in the method for fabricating a semiconductor device of Embodiment 2;

DETAILED DESCRIPTION OF THE INVENTION

Embodiment 1

A semiconductor device and a method for fabricating the same according to Embodiment 1 of the invention will now be described with reference to FIGS. 1A through 1D, 2A through 2C, 3A through 3C, 4A through 4C and 5A through 5C. In each of these drawings, a region on the left hand side of a break line corresponds to a main region where an interconnect structure is formed and a region on the right hand side of the break line corresponds to an alignment mark region where alignment accuracy measuring marks are formed.

Figure 1A:
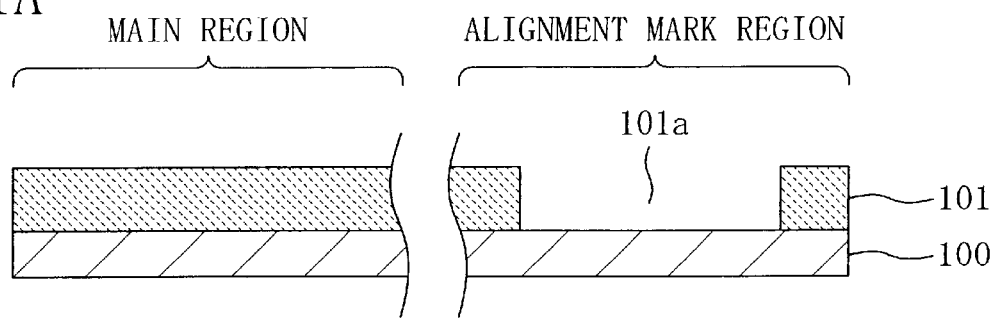
FIGS. 1A, 1B, 1C and 1D are cross-sectional views for showing procedures in a method for fabricating a semiconductor device according to Embodiment 1 of the invention.

First, as shown in FIG. 1A, an insulating film 101 of an insulating material is formed on a semiconductor substrate 100 by known CVD or spin coating. Thereafter, connection plugs (not shown) are formed in the main region of the insulating film 101 and an opening 101a is formed in the alignment mark region of the insulating film 101.

Figure 1B:
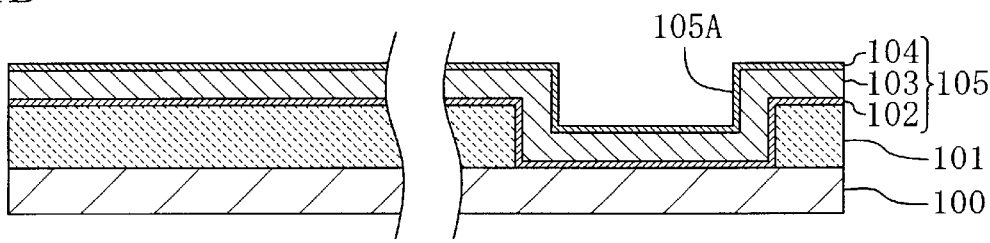

Next, as shown in FIG. 1B, a first barrier metal layer 102, a metal film 103 and a second barrier metal layer 104 are successively deposited on the insulating film 101, thereby forming an interconnect multi-layer film 105. Thus, a first alignment accuracy measuring mark 105A is formed from the interconnect multi-layer film 105 in the alignment mark region. The first barrier metal layer 102 and the second barrier metal layer 104 are formed by known sputtering, and the metal film 103 is formed by know sputtering, CVD or plating.

Figure 1C:
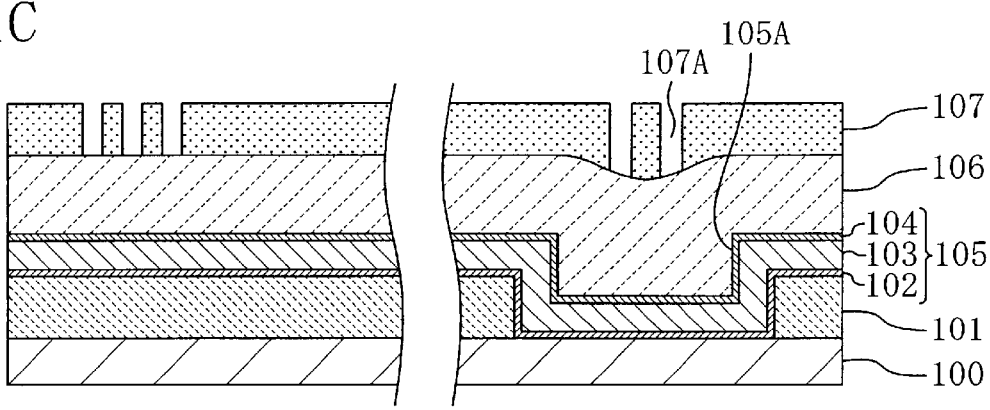

Then, as shown in FIG. 1C, a first interlayer insulating film 106 of an insulating material is formed on the interconnect multi-layer film 105 by the CVD or spin coating. Thereafter, a first resist pattern 107 is formed on the first interlayer insulating film 106 by know lithography. Alignment accuracy measurement of the first resist pattern 107 (hereinafter referred to as first alignment accuracy measurement) is carried out by using a second alignment accuracy measuring mark 107A formed in the first resist pattern 107 and the first alignment accuracy measuring mark 105A formed in the interconnect multi-layer film 105.

Figure 1D:
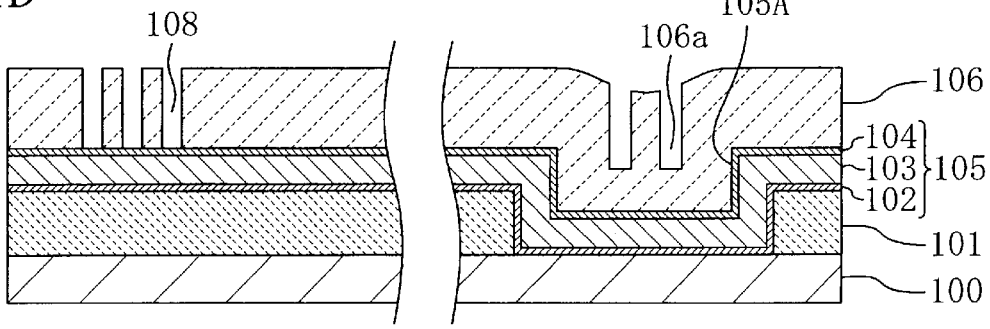

Next, the first interlayer insulating film 106 is etched by using the first resist pattern 107 as a mask, thereby forming first plug openings 108 in the first interlayer insulating film 106 as shown in FIG. 1D. Thus, the second alignment accuracy measuring mark 107A is transferred to the first interlayer insulating film 106 so as to form first recesses 106a in the alignment mark region.

Figure 2A:
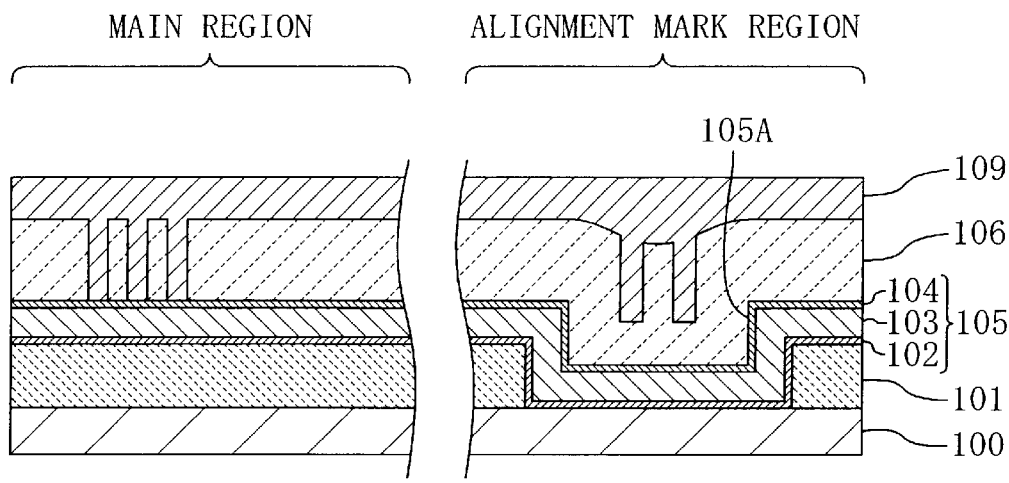
FIGS. 2A, 2B and 2C are cross-sectional views for showing other procedures in the method for fabricating a semiconductor device of Embodiment 1.

Then, as shown in FIG. 2A, a first conducting film 109 is deposited on the first interlayer insulating film 106 by the sputtering, CVD or plating so as to fill the first plug openings 108.

Figure 2B:
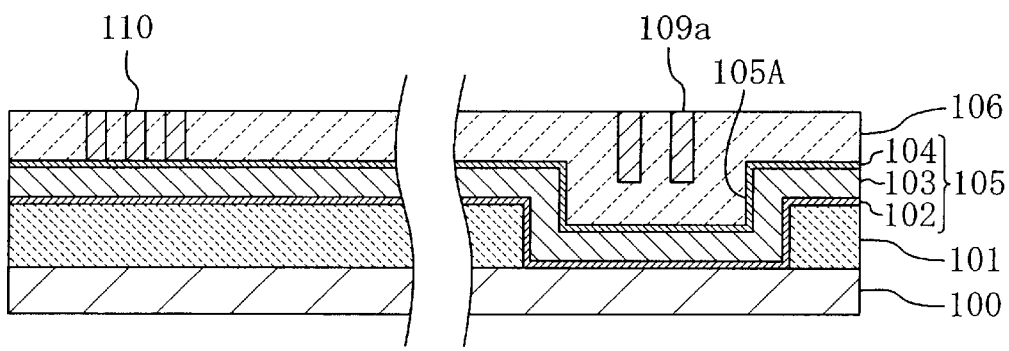

Subsequently, a portion of the first conducting film 109 present on the first interlayer insulating film 106 is removed by CMP, thereby forming first connection plugs 110 from the first conducting film 109 as shown in FIG. 2B. Thus, the first conducting film 109 is filled in the first recesses 106a of the first interlayer insulating film 106 so as to form a first conducting film pattern 109a in the alignment mark region.

As described with respect to the conventional semiconductor device and the fabrication method for the same, when the first plug opening 108 has an aspect ratio larger than approximately 4, a void is unavoidably formed in the first connection plug 110. Therefore, the thickness of the first interlayer insulating film 106 is set to such a value that the first plug opening 108 has an aspect ratio of 4 or less. Accordingly, no void is formed in the first connection plugs 110.

Figure 2C:
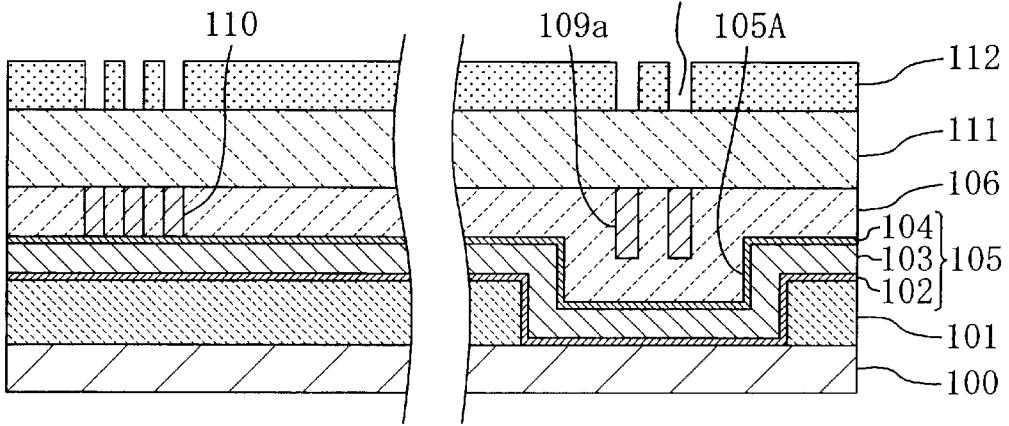

Next, as shown in FIG. 2C, a second interlayer insulating film 111 of an insulating material is formed on the first interlayer insulating film 106 by the CVD or spin coating, and thereafter, a second resist pattern 112 is formed on the second interlayer insulating film 111 by the know lithography. Alignment accuracy measurement of the second resist pattern 112 (hereinafter referred to as second alignment accuracy measurement) is carried out by using a third alignment accuracy measuring mark 112A formed in the second resist pattern 112 and the first alignment accuracy measuring mark 105A formed in the interconnect multi-layer film 105.

Figure 3A:
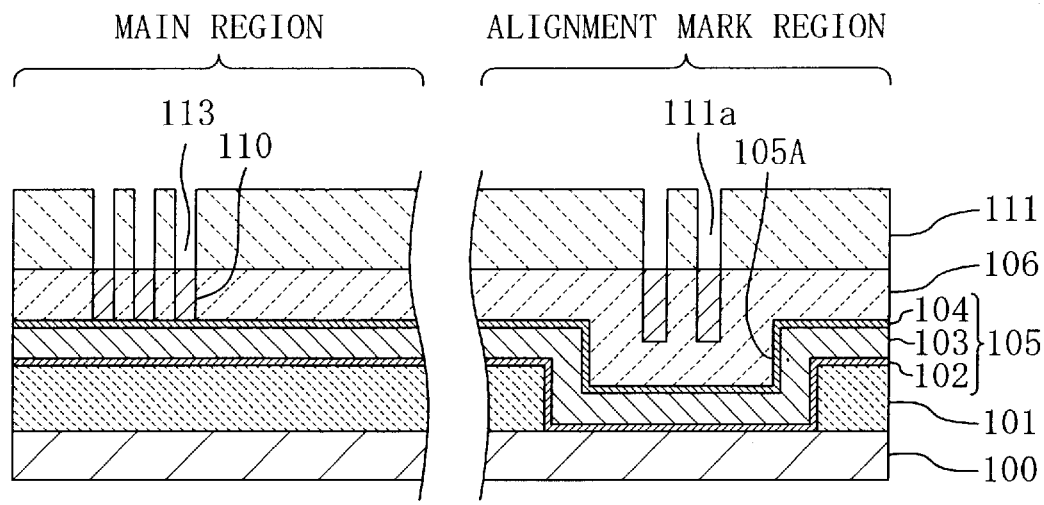
FIGS. 3A, 3B and 3C are cross-sectional views for showing still other procedures in the method for fabricating a semiconductor device of Embodiment 1.

Subsequently, the second interlayer insulating film 111 is etched by using the second resist pattern 112 as a mask, thereby forming second plug openings 113 in the second interlayer insulating film 111 as shown in FIG. 3A. Thus, the third alignment accuracy measuring mark 112A is transferred to the second interlayer insulating film 111 so as to form second recesses 111a in the alignment mark region.

Figure 3B:
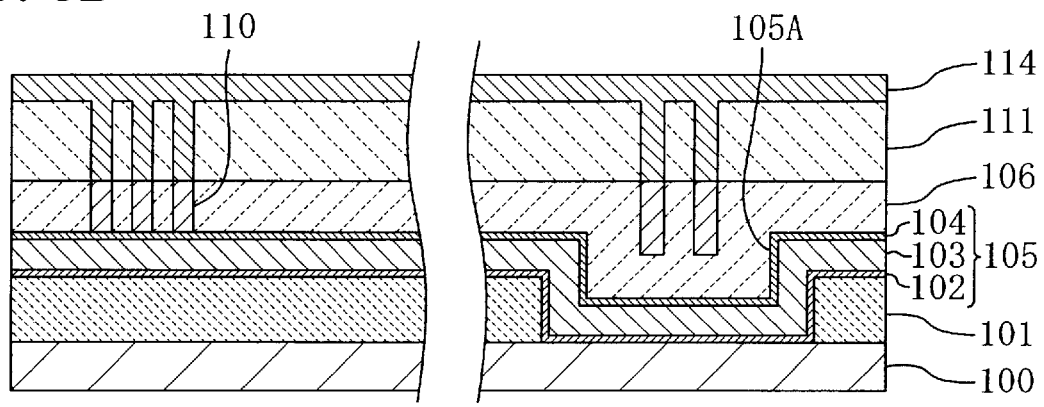

Next, as shown in FIG. 3B, a second conducting film 114 is deposited on the second interlayer insulating film 111 by the sputtering, CVD or plating so as to fill the second plug openings 113. Also in this case, the thickness of the second interlayer insulating film 111 is set to such a value that no void is formed in the second conducting film 114 within the second plug openings 113.

Figure 3C:
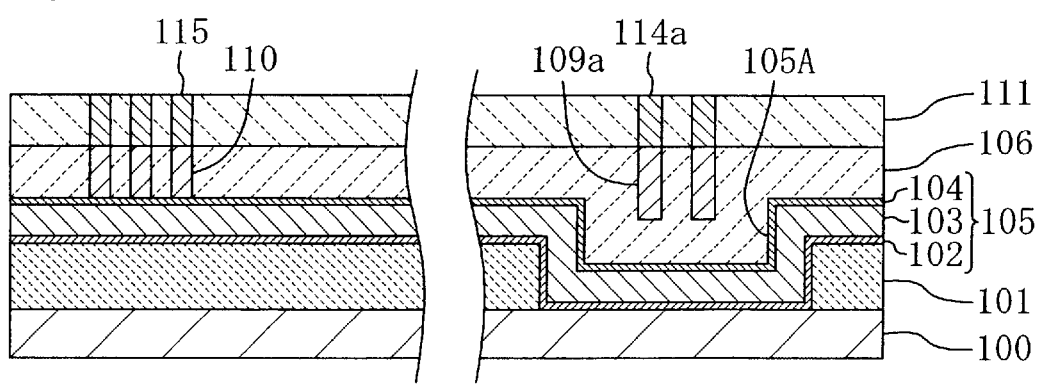

Then, a portion of the second conducting film 114 present on the second interlayer insulating film 111 is removed by the CMP, thereby forming second connection plugs 115 from the second conducting film 114 as shown in FIG. 3C. Thus, multi-layer connection plugs each composed of the first connection plug 110 and the second connection plug 115 can be formed. Furthermore, the second conducting film 114 is filled in the second recesses 111a of the second interlayer insulating film 111 so as to form a second conducting film pattern 114a in the alignment mark region.

Figure 4A:
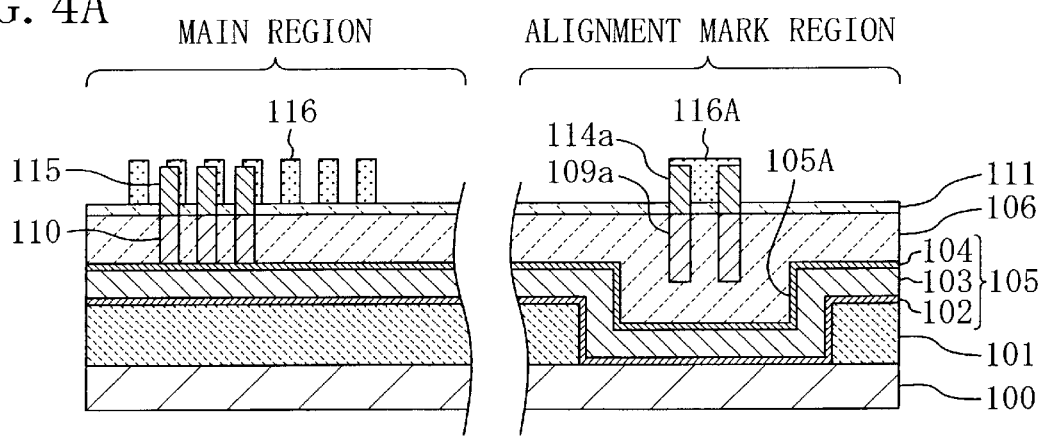
FIGS. 4A, 4B and 4C are cross-sectional views for showing still other procedures in the method for fabricating a semiconductor device of Embodiment 1.

Next, the second interlayer insulating film 111 is selectively dry etched, thereby reducing the thickness of the second interlayer insulating film 111 as shown in FIG. 4A. Thereafter, a third resist pattern 116 is formed on the second interlayer insulating film 111 with the reduced thickness. In the case where the second interlayer insulating film 111 has a small thickness, the thickness of the first interlayer insulating film 106 may be reduced with the second interlayer insulating film 111 removed.

Alignment accuracy measurement of the third resist pattern 116 (hereinafter referred to as third alignment accuracy measurement) is carried out by using a fourth alignment accuracy measuring mark 116A formed in the third resist pattern 116 and the first alignment accuracy measuring mark 105A formed in the interconnect multi-layer film 105.

Figure 4B:
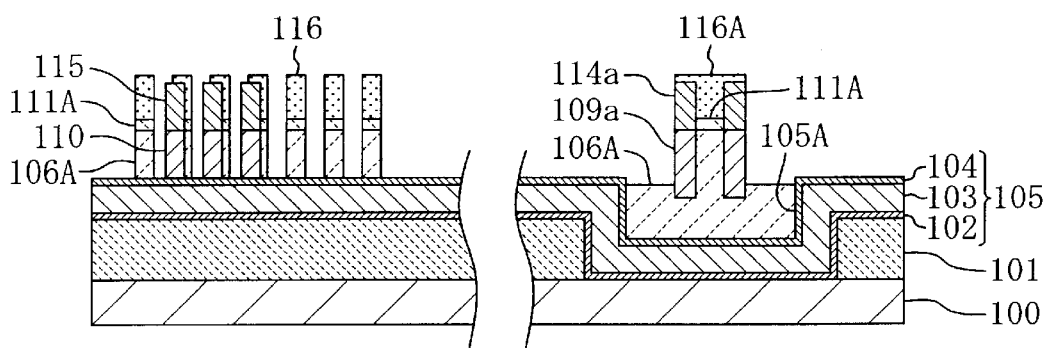

Next, the second interlayer insulating film 111 and the first interlayer insulating film 106 are etched by using the second resist pattern 116 as a mask, thereby forming a patterned second interlayer insulating film 111A and a patterned first interlayer insulating film 106A as shown in FIG. 4B.

Figure 4C:
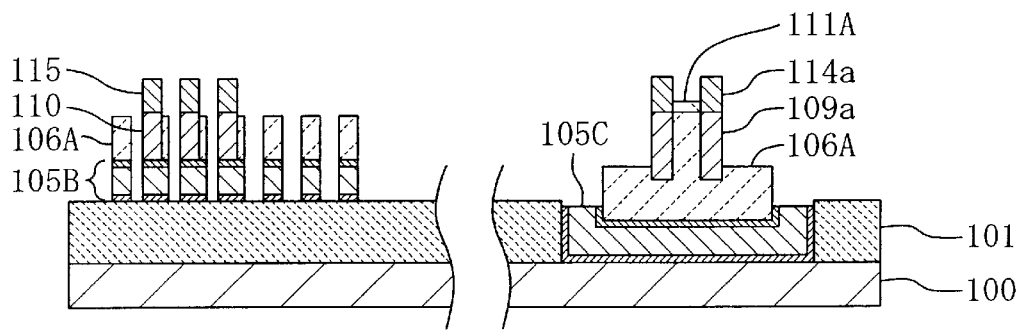

Then, the interconnect multi-layer film 105 composed of the first barrier metal layer 102, the metal film 103 and the second barrier metal layer 104 is dry etched by using the third resist pattern 116, the second connection plugs 115, the first connection plugs 110, the patterned second interlayer insulating film 111A and the patterned first interlayer insulating film 106A as a mask, thereby forming the interconnect multi-layer film 105 into lower metal interconnects 105B as shown in FIG. 4C. Thus, a patterned interconnect multi-layer film 105C is formed in the alignment mark region.

In the case where the third resist pattern 116 is used in the dry etching of the interconnect multi-layer film 105, the third resist pattern 116 is removed after the dry etching, and in the case where the third resist pattern 116 is not used in the dry etching of the interconnect multi-layer film 105, the third resist pattern 116 is removed before the dry etching. In either case, the third resist pattern 116 is generally removed by ashing using oxygen plasma.

Figure 5A:
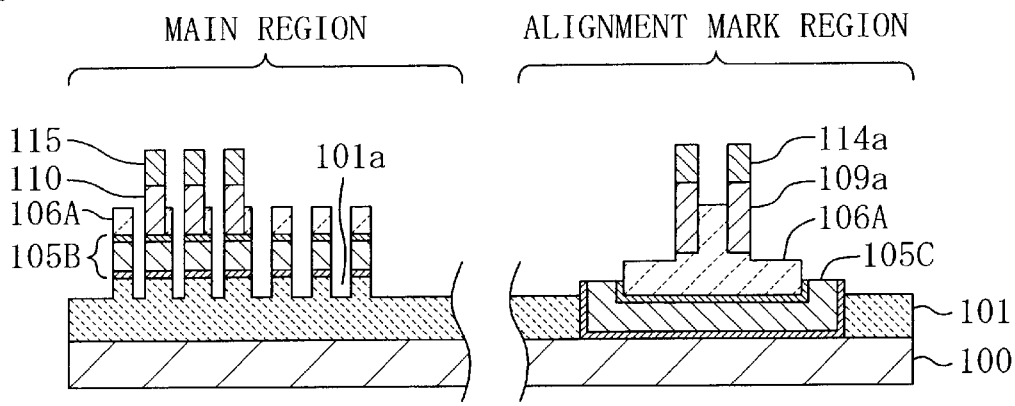
FIGS. 5A, 5B and 5C are cross-sectional views for showing still other procedures in the method for fabricating a semiconductor device of Embodiment 1.

Next, the patterned first interlayer insulating film 106A and the insulating film 101 are etched, thereby reducing the thickness of the patterned first interlayer insulating film 106A and reducing the thickness of a portion of the insulating film 101 covered with neither the lower metal interconnects 105B nor the patterned interconnect multi-layer film 105C as shown in FIG. 5A. Thus, grooves 101a are formed in the insulating film 101 between the lower metal interconnects 105B.

Figure 5B:
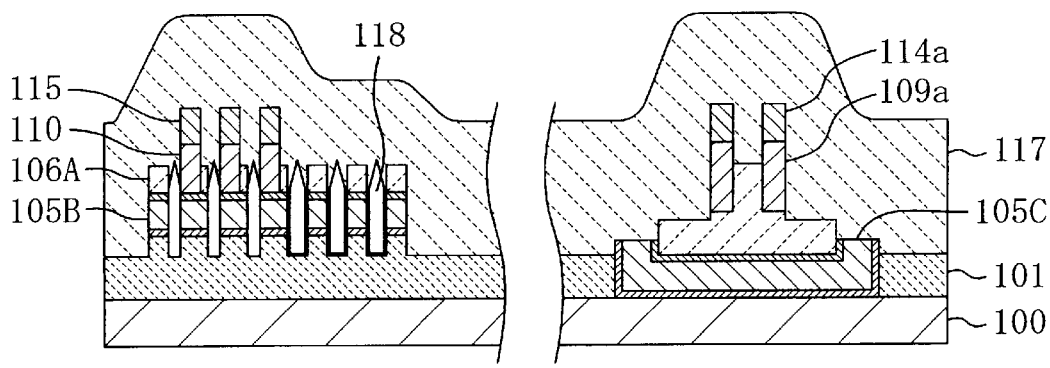

Then, as shown in FIG. 5B, a third interlayer insulating film 117 is deposited over the semiconductor substrate 100 by the CVD, thereby forming air gaps 118 between the lower metal interconnects 105B.

Figure 5C:
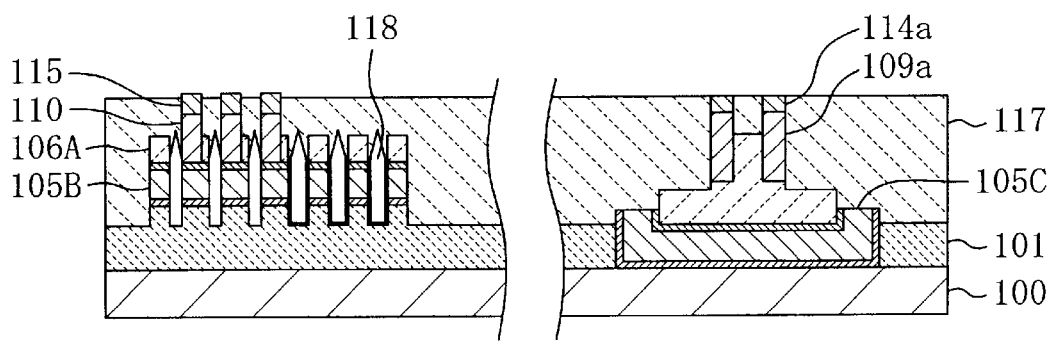

Subsequently, as shown in FIG. 5C, the third interlayer insulating film 117 is planarized by the CMP. In this manner, the metal interconnect structure having the air gaps 118 is obtained.

As described above, the thickness of the first interlayer insulating film 106 is set to such a value that no void is formed in the first connection plugs 110 and the thickness of the second interlayer insulating film 111 is set to such a value that no void is formed in the second connection plugs 115, namely, the thicknesses of the first interlayer insulating film 106 and the second interlayer insulating film 111 are respectively set to such values that the first plug openings 108 and the second plug openings 113 have an aspect ratio of 4 or less. Therefore, no void is formed in the connection plug composed of the first connection plug 110 and the second connection plug 115.

Accordingly, according to Embodiment 1, the metal interconnect structure having the air gaps between the lower metal interconnects 105B can be formed without forming voids in the connection plugs.

When a series of processes described above (from the procedure of FIG. 1B to the procedure of FIG. 5C) are repeatedly carried out, a multi-layer interconnect structure having an air gap can be obtained.

In Embodiment 1, an interlayer insulating film disposed between the lower metal interconnects 105 and upper metal interconnects is composed of the first interlayer insulating film 106 and the second interlayer insulating film 111. However, in the case where connection plugs free from voids cannot be formed by using these two interlayer insulating films alone, it is preferred that the procedures of FIGS. 1C through 2B are repeated so as to form, between the lower metal interconnects 105 and the upper metal interconnects, an interlayer insulating film composed of three or more layers and connection plugs having a multi-layer structure of three or more layers.

As described above, according to Embodiment 1, the metal interconnect structure having the air gaps between the lower metal interconnects 105 can be formed without forming voids in the connection plugs. However, the alignment accuracy measurement has the following problem, which will be described with reference to FIGS. 6A through 6C, 7A, 7B and 8A through 8C:

The first alignment accuracy measurement described with reference to FIG. 1C will now be described with reference to FIGS. 6A through 6C.

Figure 6A:
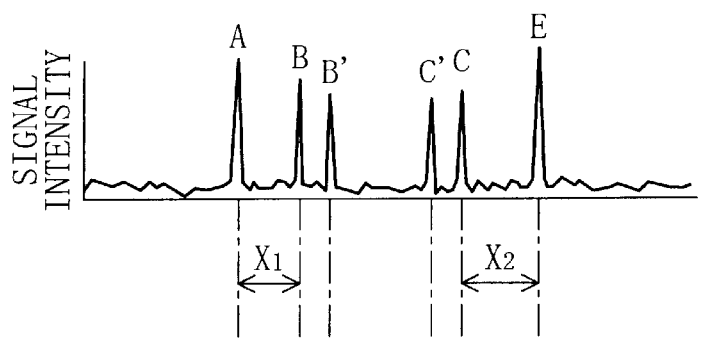
FIGS. 6A, 6B and 6C are diagrams for explaining first alignment accuracy measurement carried out in the method for fabricating a semiconductor device of Embodiment 1, and specifically.
Figure 6B:
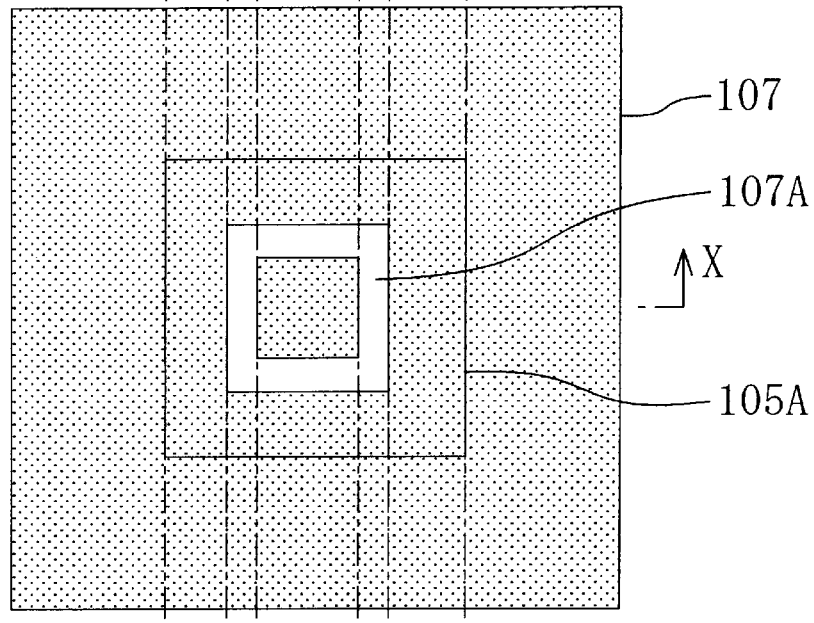
Figure 6C:
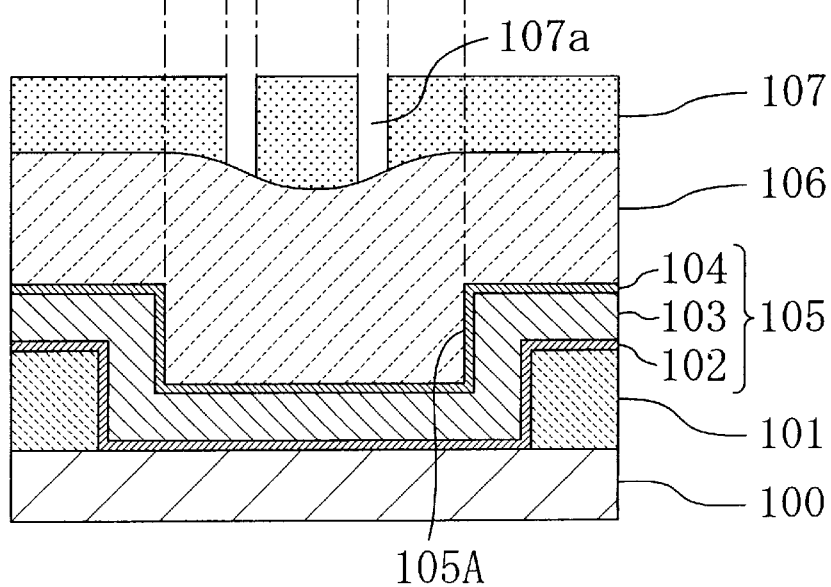

FIG. 6A shows a measurement signal obtained through measurement using an alignment accuracy measuring apparatus based on an optical sizer by observing the alignment mark region from above in the vertical direction, FIG. 6B shows the plane structure of the alignment mark region and FIG. 6C shows the cross-sectional structure of the alignment mark region taken along line X—X of FIG. 6B.

The alignment accuracy of the first resist pattern 107 is measured by detecting positions of the outer edges of the first alignment accuracy measuring mark 105A and the second alignment accuracy measuring mark 107A, and FIG. 6A shows the measurement signal obtained in this detection. In the case where the most simple measurement is employed, the positions of the outer edges of the first alignment accuracy measuring mark 105A are detected in accordance with signal peaks A and E and the positions of the outer edges of the second alignment accuracy measuring mark 107A are detected in accordance with signal peaks B and C, so that a difference between a distance between the peaks A and B (distance $X_1$) and a distance between the peaks C and E (distance $X_2$) can be calculated on the basis of the detected signal peaks A, B, C and E. In the most simple measurement, signal peaks B' and C' are not used.

The second alignment accuracy measurement described with reference to FIG. 2C will now be described with reference to FIGS. 7A and 7B.

Figures 7A, 7B:
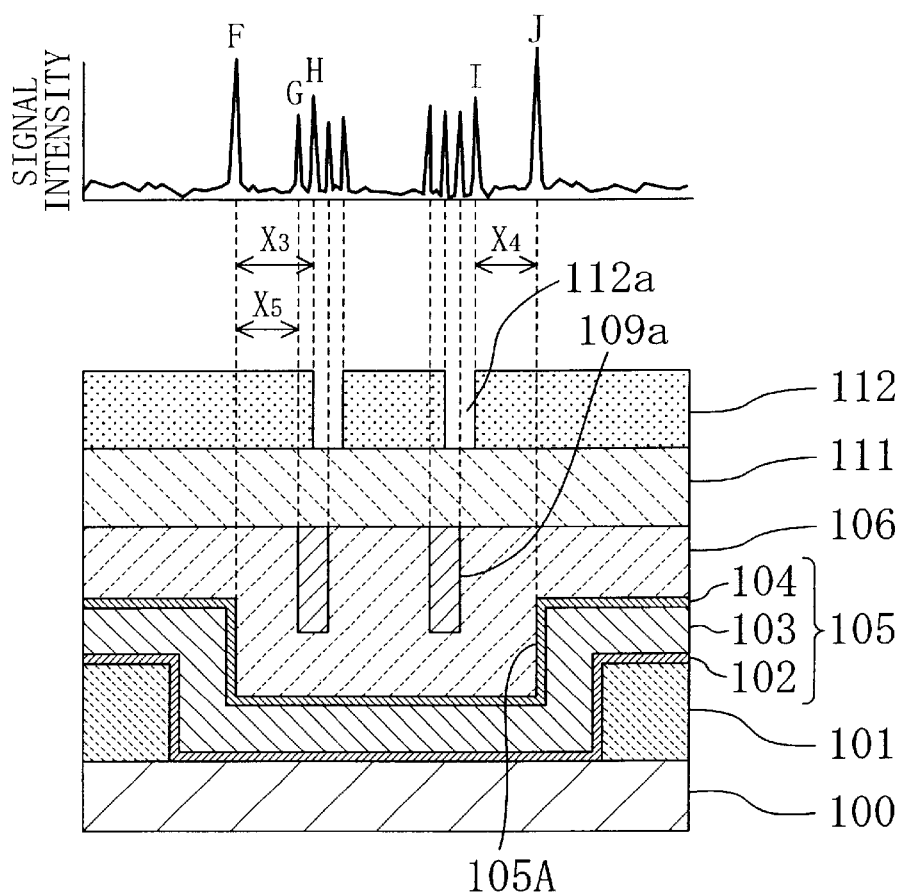
FIGS. 7A and 7B are diagrams for explaining second alignment accuracy measurement carried out in the method for fabricating a semiconductor device of Embodiment 1, and specifically.

FIG. 7A shows a measurement signal obtained through the measurement using the alignment accuracy measuring apparatus based on an optical sizer by observing the alignment mark region from above in the vertical direction, and FIG. 7B shows the cross-sectional structure of the alignment mark region.

The alignment accuracy of the second resist pattern 112 is measured by detecting positions of the outer edges of the first alignment accuracy measuring mark 105A and the third alignment accuracy measuring mark 112A, and FIG. 7A shows the measurement signal obtained in this detection. The positions of the outer edges of the first alignment accuracy measuring mark 105A are detected in accordance with signal peaks F and J and the positions of the outer edges of the third alignment accuracy measuring mark 112A are detected in accordance with signal peaks H and I, so that a difference between a distance between the peaks F and H (distance $X_3$) and a distance between the peaks J and I (distance $X_4$) can be calculated on the basis of the detected signal peaks F, J, H and I.

However, since the first conducting film pattern 109a is formed in the first interlayer insulating film 106 in the procedure of FIG. 2B, not only the signal peaks F, J, H and I but also a signal peak G in accordance with the outer edge of the first conducting film pattern 109a is detected. Therefore, the signal peak G may be mistaken for the signal peak H, so that a distance between the peaks F and G (distance $X_5$) can be confused with the distance between the peaks F and H (distance $X_3$). As a result, there arises a problem that the alignment accuracy measurement cannot be accurately carried out.

The third alignment accuracy measurement described with reference to FIG. 4A will now be described with reference to FIGS. 8A through 8C.

Figures 8A, 8B, 8C:
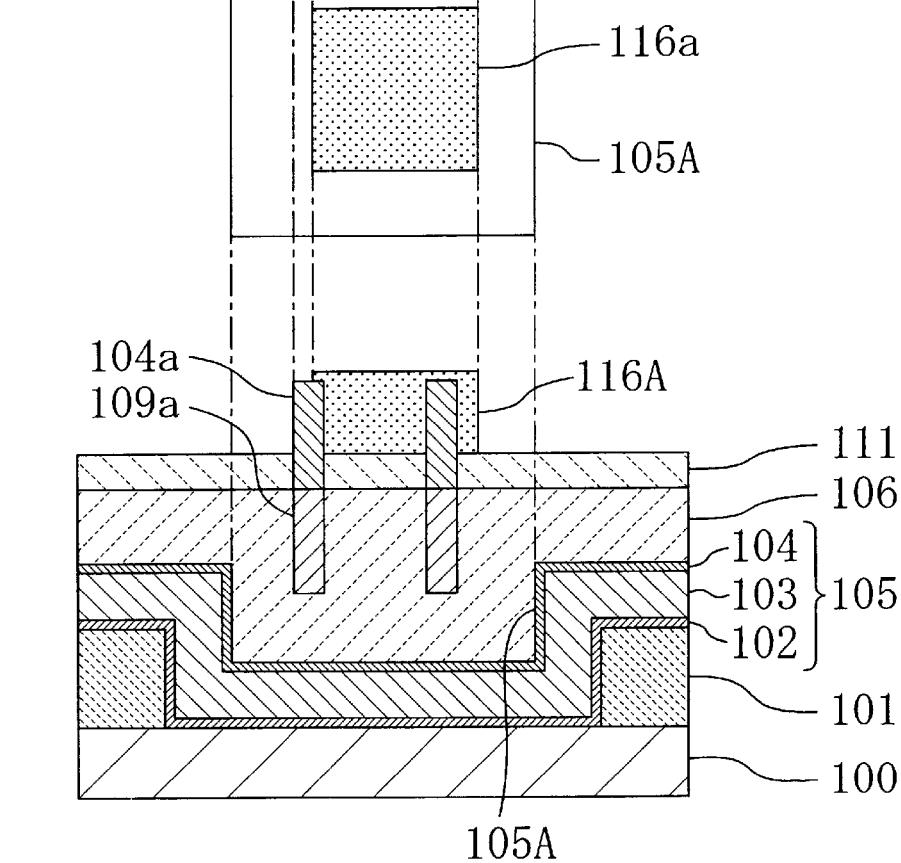
FIGS. 8A, 8B and 8C are diagrams for explaining third alignment accuracy measurement carried out in the method for fabricating a semiconductor device of Embodiment 1, and specifically.

FIG. 8A shows a measurement signal obtained through the measurement using the alignment accuracy measuring apparatus based on an optical sizer by observing the alignment mark region from above in the vertical direction, FIG. 8B shows the plane structure of the alignment accuracy measuring mark and FIG. 8C shows the cross-sectional structure of the alignment mark region.

The alignment accuracy of the third resist pattern 116 is measured by detecting positions of the outer edges of the first alignment accuracy measuring mark 105A and the fourth alignment accuracy measuring mark 116A, and FIG. 8A shows the measurement signal obtained in this detection. The positions of the outer edges of the first alignment accuracy measuring mark 105A are detected in accordance with signal peaks K and O and the positions of the outer edges of the fourth alignment accuracy measuring mark 116A are detected in accordance with signal peaks L and M, so that a difference between a distance between the peaks K and L (distance $X_6$) and a distance between the peaks M and O (distance $X_7$) can be calculated on the basis of the detected signal peaks K, O, L and M.

However, since the second conducting film pattern 114a is formed in the second interlayer insulating film 111 in the procedure of FIG. 3C, not only the signal peaks K, O, L and M but also a signal peak N in accordance with the outer edge of the second conducting film pattern 114a is detected. Therefore, the signal peak N may be mistaken for the signal peak L, so that a distance between the peaks K and N (distance $X_8$) can be confused with the distance between the peaks K and L (distance $X_6$). As a result, the alignment accuracy measurement cannot be accurately carried out.

The alignment accuracy of the third resist pattern 116 is carried out by detecting the positions of the outer edges of the first alignment accuracy measuring mark 105A and the fourth alignment accuracy measuring mark 116A for the following reason:

In the procedure for forming the lower metal interconnects 105B by patterning the interconnect multi-layer film 105, the first connection plugs 110 are also used as the mask, namely, the first connection plugs 110 and the lower metal interconnects 105B have a self-alignment structure. Therefore, even when the second resist pattern 112 used for forming the first plug openings 108 is slightly shifted in its position, there is no fear of the positional shift of the first connection plugs 110 with respect to the lower metal interconnects 105B.

However, when the second conducting film pattern 114a is used as the alignment accuracy measuring mark in aligning the third resist pattern 116 for forming the lower metal interconnects 105B, since the second conducting film pattern 114a is shifted in its position if the second connection plugs 115 are shifted in their positions from the first connection plugs 110, alignment accuracy between the lower metal interconnects 105B and the plugs not shown and buried in the insulating film 101 is lowered.

Accordingly, in aligning the third resist pattern 116, not the second conducting film pattern 114a but the first alignment accuracy measuring mark 105A simultaneously formed as the plugs in the insulating film 101 is used.

In this manner, when the signal peak G is mistaken for the signal peak H in the second alignment measurement or the signal peak N is mistaken for the signal peak L in the third alignment accuracy measurement, the reliability of the multi-layer interconnect structure is largely lowered.

The problem arises because the same photomask is used in forming the first resist pattern 107 and the second resist pattern 112.

Also, the problem arises because the photomask used in forming the first resist pattern 107 and the second resist pattern 112 use the same alignment mark region as the photomask used in forming the third resist pattern 116.

Accordingly, the problem can be avoided when the photomask for forming the first resist pattern 107 and the photomask for forming the second resist pattern 112 are different from each other and use different alignment mark regions. Furthermore, the problem can be avoided when the photomask for forming the third resist pattern 116 uses a different alignment mark region from the photomask for forming the first resist pattern 107 and the photomask for forming the second resist pattern 112.

However, when the photomasks are different in the aforementioned manner, it is necessary to use photomasks in the number according to the number of layers included in the multi-layer structure of connection plugs, which disadvantageously largely increases the area of the alignment mark region and the fabrication cost.

Accordingly, a method for fabricating a semiconductor device according to Embodiment 2 described below is significant.

Embodiment 2

A semiconductor device and a method for fabricating the semiconductor device according to Embodiment 2 of the invention will now be described with reference to FIGS. 9A through 9C, 10A, 10B and 11A through 11C. Since Embodiment 2 is different from Embodiment 1 in merely a method for forming an alignment mark region, the alignment mark region alone will be described in Embodiment 2.

Figure 9A:
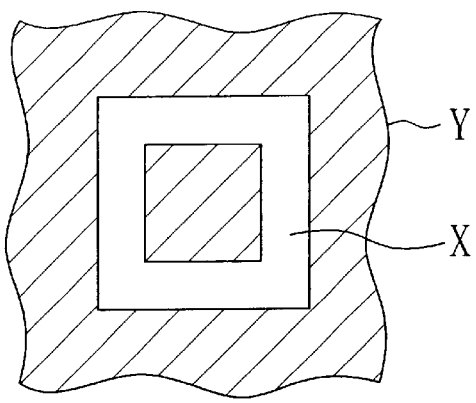
FIGS. 9A, 9B and 9C are cross-sectional views for showing procedures in a method for fabricating a semiconductor device of Embodiment 2.

First, as shown in FIG. 9A, a photomask Y having an alignment accuracy measuring mark forming portion X, that is, a transmission portion in the plane shape of a rectangular frame with an opening width substantially smaller than the resolution limit of exposing light, is prepared in the alignment mark region.

Now, formation of a first resist pattern 107 and first alignment accuracy measurement will be described.

Figure 9B:
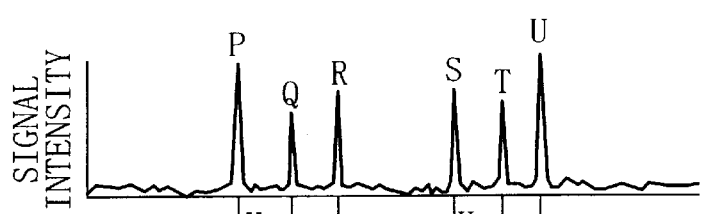
Figure 9C:
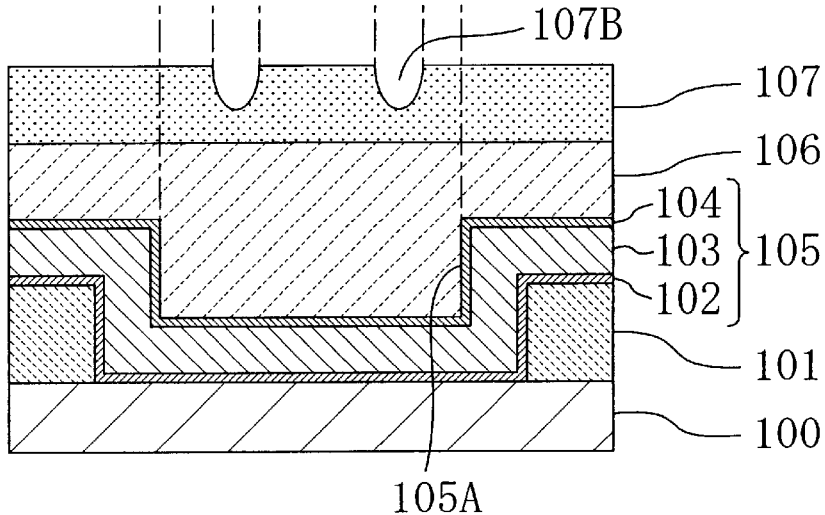

In the same manner as described in Embodiment 1 with reference to FIG. 1C, after forming a first interlayer insulating film 106 of an insulating material on an interconnect multi-layer film 105, the first resist pattern 107 is formed on the first interlayer insulating film 106 by the know lithography as shown in FIG. 9C.

At this point, the first resist pattern 107 is formed through exposure using the photomask Y of FIG. 9A in Embodiment 2.

Thus, a second alignment accuracy measuring mark 107B of a groove in the plane shape of a rectangular frame having a depth substantially smaller than a half of the thickness of the resist film is formed in the alignment mark region of the first resist pattern 107 as shown in FIG. 9C.

The depth of the second alignment accuracy measuring mark 107B is not specified as far as it has such a depth that the first resist pattern 107 is not penetrated in the etching of the first interlayer insulating film 106.

The alignment accuracy measuring mark forming portion X for forming the second alignment accuracy measuring mark 107B may be a portion of an attenuated phase-shifting mask with reduced light transmittance instead of the transmission portion with an opening width smaller than the resolution limit of the exposing light.

The alignment accuracy of the first resist pattern 107 is measured by detecting positions of the edges of the first alignment accuracy measuring mark 105A and the second alignment accuracy measuring mark 107B. FIG. 9B shows a measurement signal obtained through the measurement using the alignment accuracy measuring apparatus based on an optical sizer by observing the alignment mark region from above in the vertical direction.

The positions of the outer edges of the first alignment accuracy measuring mark 105A are detected in accordance with signal peaks P and U, the positions of the inner edges of the second alignment accuracy measuring mark 107B are detected in accordance with signal peaks R and S, and the positions of the outer edges of the second alignment accuracy measuring mark 107B are detected in accordance with signal peaks Q and T. The alignment accuracy is measured by calculating, on the basis of the detected signal peaks P, U, R, S, Q and T, a difference between a distance between the peaks P and R (distance $X_{11}$) and a distance between the peaks S and U (distance $X_{12}$) or a difference between a distance between the peaks P and Q (distance $X_{13}$) and a distance between the peaks T and U (distance $X_{14}$).

In Embodiment 2, since the second alignment accuracy measuring mark 107B of the groove having a depth substantially smaller than a half of the thickness of the resist film is formed in the alignment mark region of the first resist pattern 107, no recess is formed in the first interlayer insulating film 106 after the etching using the first resist pattern 107 as a mask. Therefore, the first conducting film pattern 109a as shown in FIG. 2B is not formed in Embodiment 2.

Now, formation of a second resist pattern 112 and second alignment accuracy measurement will be described.

Figure 10A:
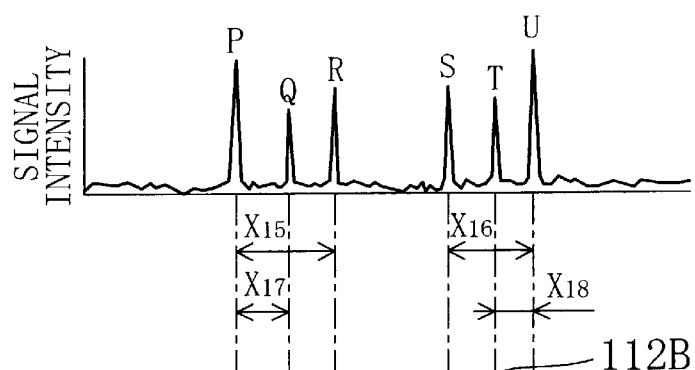
FIGS. 10A and 10B are cross-sectional views for showing other procedures in the method for fabricating a semiconductor device of Embodiment 2.
Figure 10B:
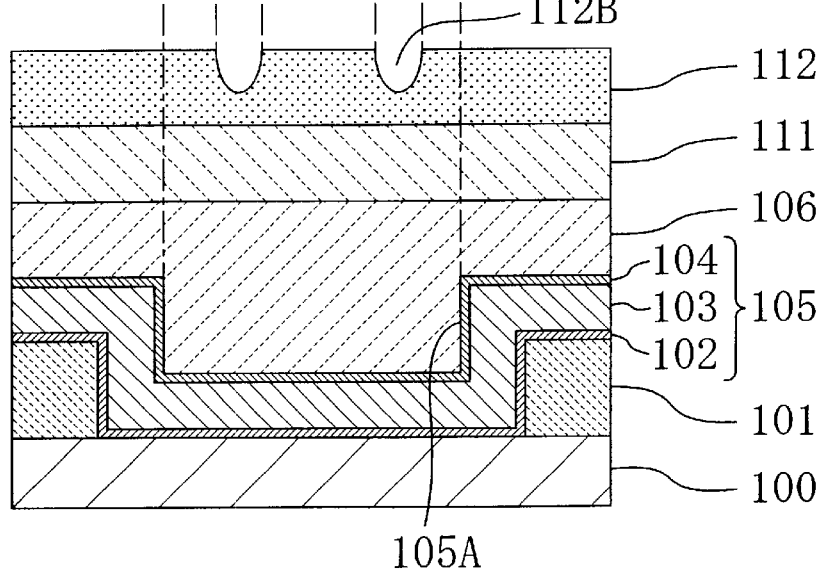
Figure 12A:
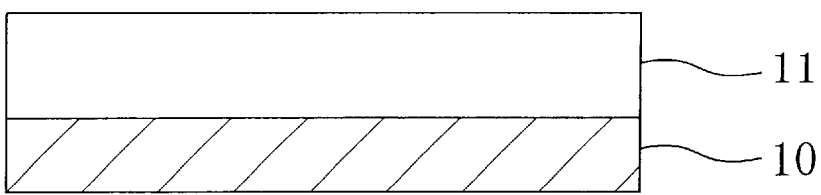
FIGS. 12A, 12B, 12C and 12D are cross-sectional views for showing procedures in a method for fabricating a conventional semiconductor device.
Figure 12B:
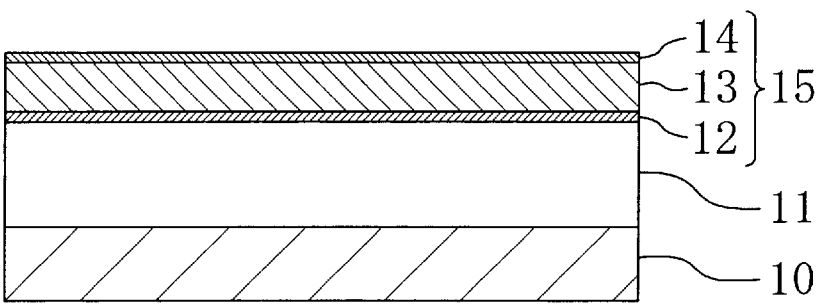
Figure 12C:
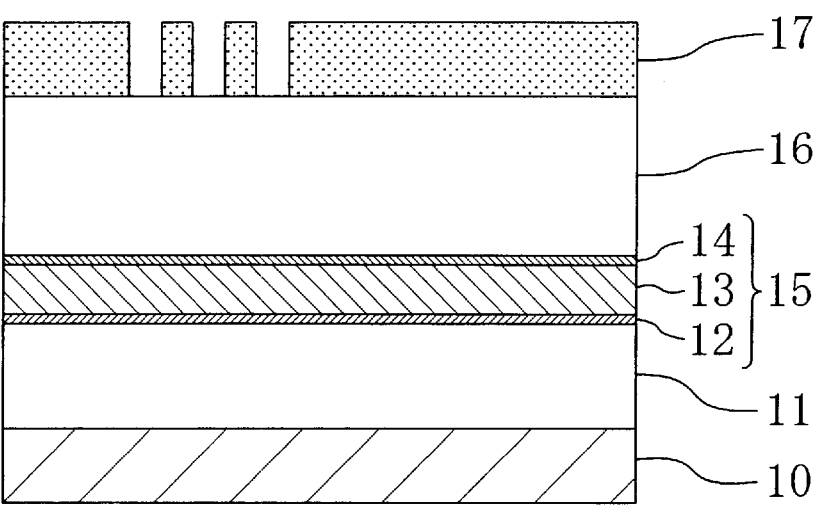
Figure 12D:
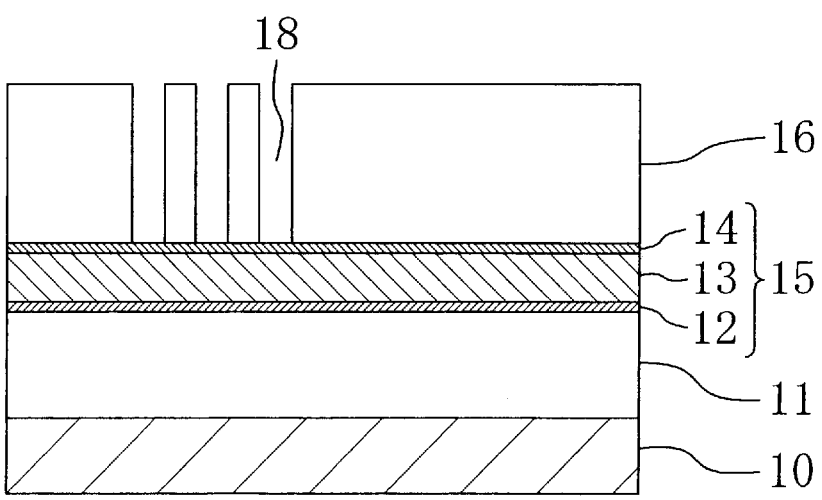
Figure 13A:
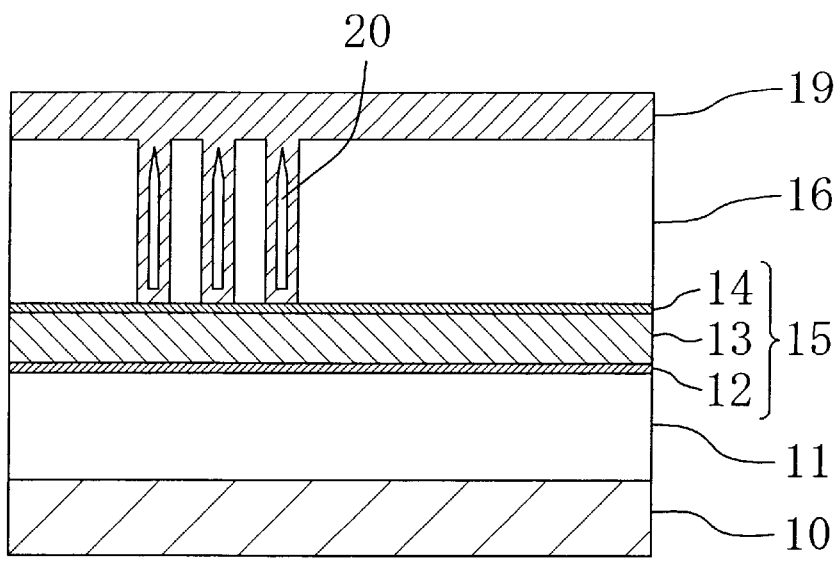
FIGS. 13A, 13B and 13C are cross-sectional views for showing other procedures in the method for fabricating a conventional semiconductor device.
Figure 13B:
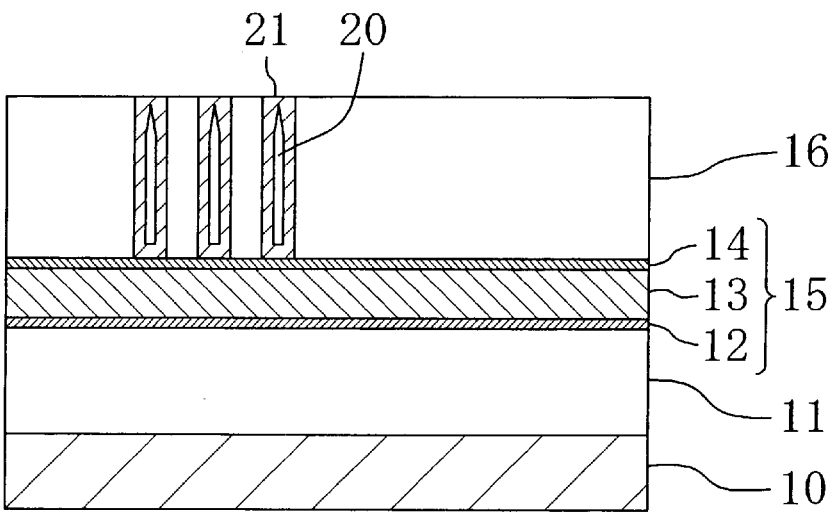
Figure 13C:
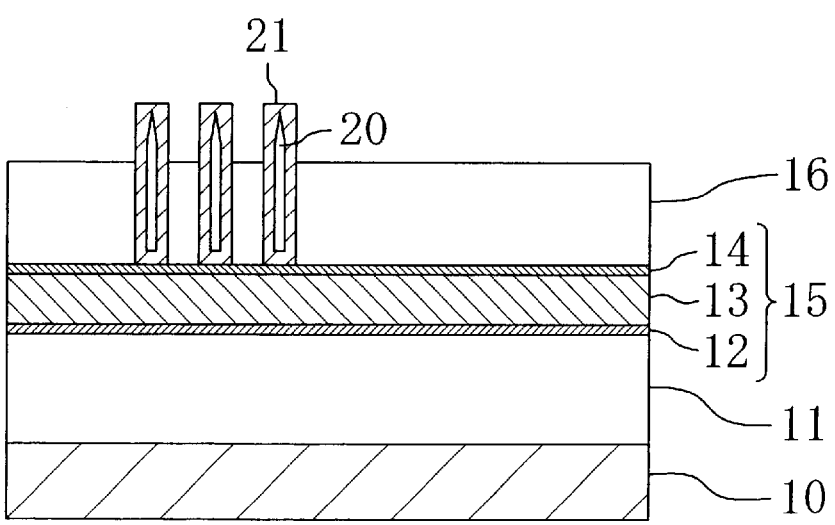
Figure 14A:
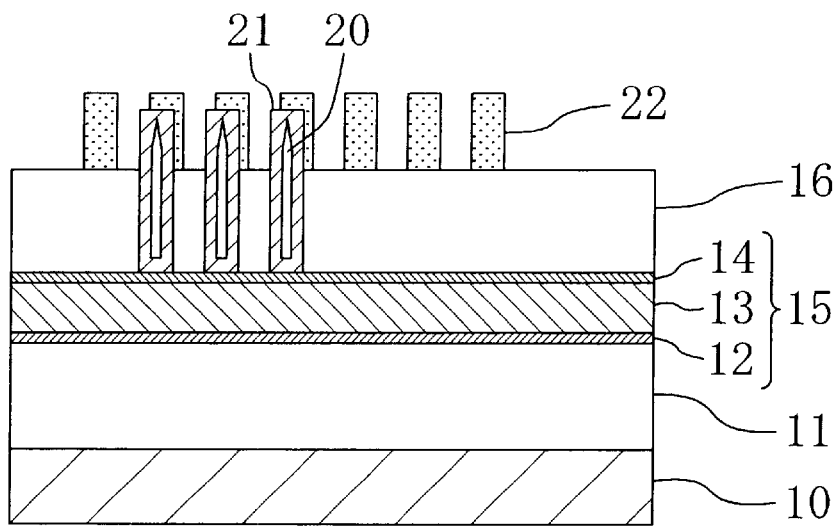
FIGS. 14A, 14B and 14C are cross-sectional views for showing still other procedures in the method for fabricating a conventional semiconductor device.
Figure 14B:
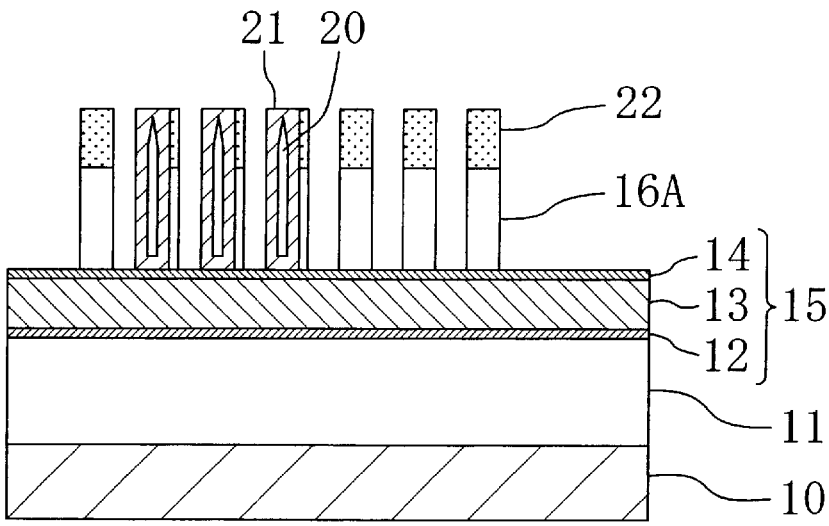
Figure 14C:
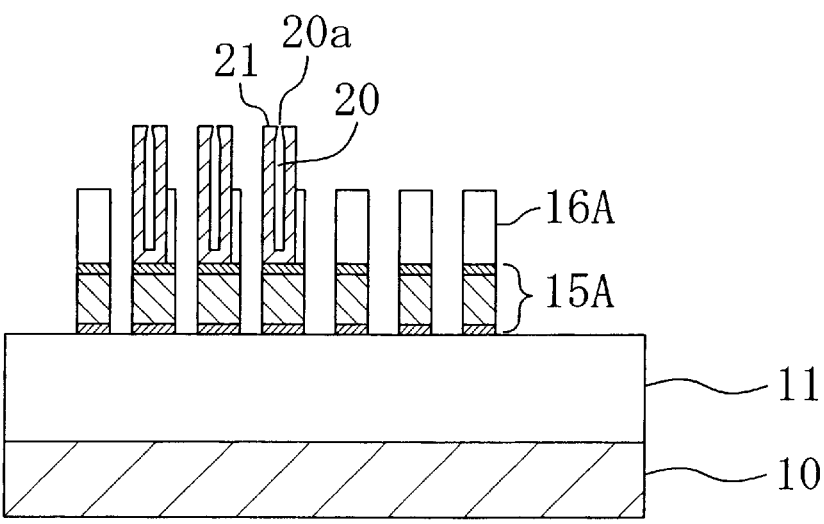
Figure 15A:
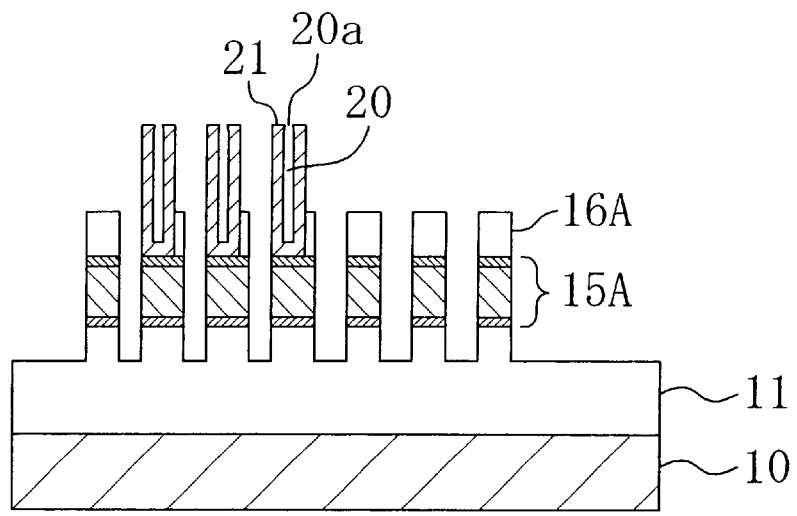
FIGS. 15A, 15B and 15C are cross-sectional views for showing still other procedures in the method for fabricating a conventional semiconductor device.
Figure 15B:
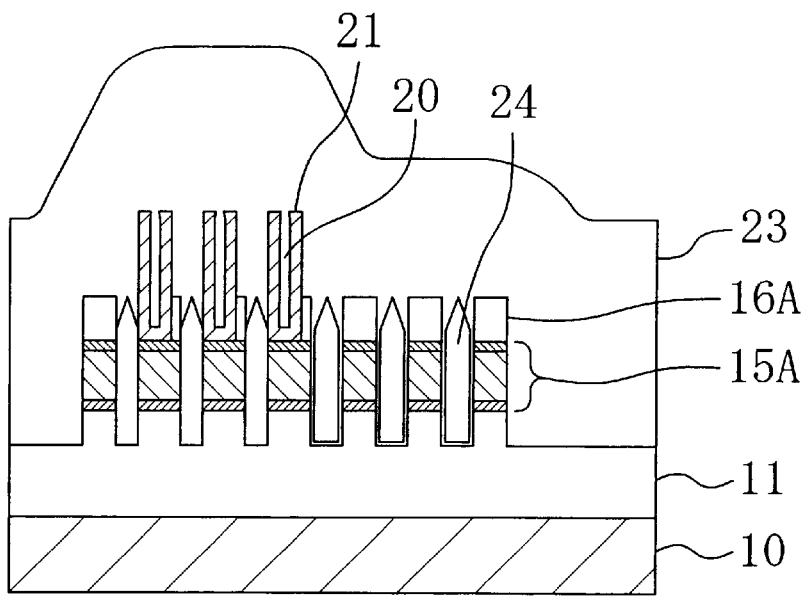
Figure 15C:
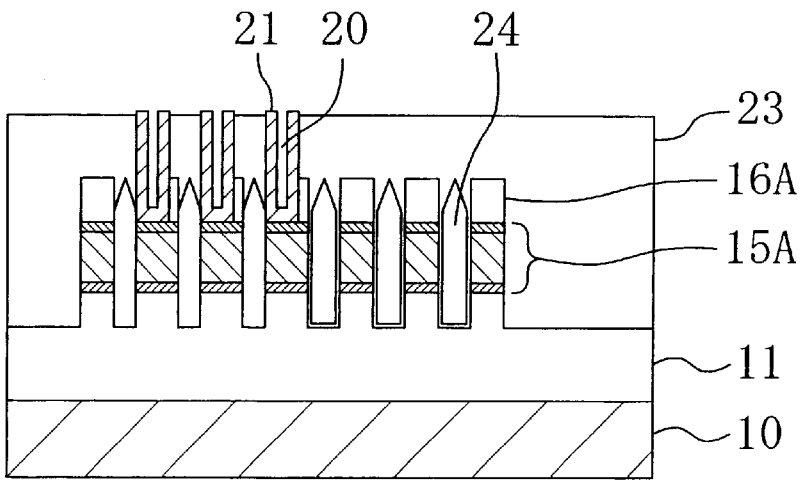

In the same manner as described in Embodiment 1 with reference to FIG. 2C, after forming a second interlayer insulating film 111 of an insulating material on the first interlayer insulating film 106, the second resist pattern 112 is formed on the second interlayer insulating film 111 by the known lithography as shown in FIG. 10B.

In this case, the photomask used for forming the first resist pattern 107 is used for forming the second resist pattern 112. Accordingly, a third alignment accuracy measuring mark 112B of a groove in the plane shape of a rectangular frame having a depth substantially smaller than a half of the thickness of the resist film is formed in the alignment mark region of the second resist pattern 112.

The depth of the third alignment accuracy measuring mark 112B is not specified as far as it has such a depth that the second resist pattern 112 is not penetrated in the etching of the second interlayer insulating film 111.

The alignment accuracy of the second resist pattern 112 is measured by detecting positions of the edges of the first alignment accuracy measuring mark 105A and the third alignment accuracy measuring mark 112B. FIG. 10A shows a measurement signal obtained through the measurement using the alignment accuracy measuring apparatus based on an optical sizer by observing the alignment mark region from above in the vertical direction.

The positions of the outer edges of the first alignment accuracy measuring mark 105A are detected in accordance with signal peaks P and U, the positions of the inner edges of the third alignment accuracy measuring mark 112B are detected in accordance with signal peaks R and S, and the positions of the outer edges of the third alignment accuracy measuring mark 112B are detected in accordance with signal peaks Q and T. The alignment accuracy is measured by calculating, on the basis of the detected signal peaks P, U, R, S, Q and T, a difference between a distance between the peaks P and R (distance $X_{15}$) and a distance between the peaks S and U (distance $X_{16}$) or a difference between a distance between the peaks P and Q (distance $X_{17}$) and a distance between the peaks T and U (distance $X_{18}$).

In Embodiment 2, since no recess is formed in the first interlayer insulating film 106 as described above, the first conducting film pattern 109a as shown in FIG. 2B is not formed. Therefore, a signal peak in accordance with the first conducting film pattern 109a is not detected. Accordingly, in the second alignment accuracy measurement, the alignment can be highly accurately measured.

Also, since the third alignment accuracy measuring mark 112B of the groove having a depth substantially smaller than a half of the thickness of the resist film is formed in the alignment mark region of the second resist pattern 112, no recess is formed in the second interlayer insulating film 111 after the etching using the second resist pattern 112 as a mask. Therefore, the second conducting film pattern 114a as shown in FIG. 3C is not formed in Embodiment 2.

Now, formation of a third resist pattern 116 and third alignment accuracy measurement will be described.

In the same manner as described in Embodiment 1 with reference to FIG. 4A, after reducing the thickness of the second interlayer insulating film 111, the third resist pattern 116 is formed on the second interlayer insulating film 111 with the reduced thickness as shown in FIG. 1C. In this case, a fourth alignment accuracy measuring mark 116B in the shape of a protrusion is formed in the same manner as in Embodiment 1.

The alignment accuracy of the third resist pattern 116 is measured by detecting positions of the edges of the first alignment accuracy measuring mark 105A and the fourth alignment accuracy measuring mark 116B. FIG. 11A shows a measurement signal obtained through the measurement using the alignment accuracy measuring apparatus based on an optical sizer by observing the alignment mark region from above in the vertical direction.

The positions of the outer edges of the first alignment accuracy measuring mark 105A are detected in accordance with signal peaks V and Z and the positions of the outer edges of the fourth alignment accuracy measuring mark 116A are detected in accordance with signal peaks W and Y. The alignment accuracy of the third resist pattern 116 is measured by calculating a difference between a distance between the peaks V and W (distance $X_{19}$) and a distance between the peaks Z and Y (distance $X_{20}$) on the basis of the detected signal peaks V, Z, W and Y.

In Embodiment 2, since no recess is formed in the second interlayer insulating film 111 as described above, the second conducting film pattern 114a as shown in FIG. 3C is not formed. Therefore, a signal peak in accordance with the second conducting film pattern 114a is not detected. Accordingly, in the third alignment accuracy measurement, the alignment can be highly accurately measured.

In this manner, according to Embodiment 2, the alignment can be highly accurately measured in forming the second resist pattern 112 and the third resist pattern 116. Therefore, highly aligned multi-layer connection plugs each composed of a first connection plug 110 and a second connection plug 115 can be formed, and the positional shift between the multi-layer connection plugs and lower metal interconnects 105B can be minimized.

Each of the insulating film 101 and the first through third interlayer insulating films 106, 111 and 117 can be made from a silicon oxide film including no impurity; a silicon oxide film including boron, phosphorus, fluorine, hydrogen, carbon or a methyl group; a low dielectric film having an inorganic or organic atom or molecule in a siloxane skeleton; or a low dielectric film of an organic film.

Furthermore, each of the insulating film 101 and the first through third interlayer insulating films 106, 111 and 117 can be a multi-layer film formed through a plurality of film forming procedures or a multi-layer film formed by appropriately combining any of an organic film, an inorganic film and an organic-inorganic hybrid film.

The metal film 103 can be made from a metal with low resistance, such as Al, Cu, Ag, Au and Pt, or an alloy including any of these metals as a principal constituent. Furthermore, each of the first barrier metal layer 102 and the second barrier metal layer 104 can be made from a metal with a high melting point, such as Ti and Ta, or a nitride of any of these metals.

Each of the first conducting film 109 and the second conducting film 114 can be made from a metal with low resistance, such as Al, Cu, Ag, Au and Pt, an alloy including any of these metals as a principal constituent, or a metal with a high melting point such as W. Alternatively, a semiconductor material such as polysilicon can be used instead of such a metal.

Although the first, second and third resist patterns 107, 112 and 116 are used as the mask patterns in Embodiments 1 and 2, a hard mask may be used instead.

What is claimed is:

1. A method for fabricating a semiconductor device comprising:

a first step of depositing a metal film on an insulating film on a semiconductor substrate;

a second step of forming a first mask pattern on a first interlayer insulating film formed on said metal film and forming first plug openings in said first interlayer insulating film by etching said first interlayer insulating film with said first mask pattern used as a mask;

a third step of forming first connection plugs by filling a first conducting film in said first plug openings;

a fourth step of forming a second mask pattern on a second interlayer insulating film formed on said first interlayer insulating film and forming second plug openings respectively on said first connection plugs in said second interlayer insulating film by etching said second interlayer insulating film with said second mask pattern used as a mask;

a fifth step of forming second connection plugs by filling a second conducting film in said second plug openings;

a sixth step of forming said metal film into metal interconnects by etching said metal film with at least said first connection plugs and said second connection plugs used as a mask; and a seventh step of forming a third interlayer insulating film on said metal interconnects so as to form an air gap between said metal interconnects.

2. The method for fabricating a semiconductor device of claim 1, further comprising a step of forming multi-layer metal interconnects on said third interlayer insulating film by repeatedly carrying out procedures from the first step to the seventh step.

3. The method for fabricating a semiconductor device of claim 1, wherein said first mask pattern has an alignment accuracy measuring mark with a thickness not penetrated in etching for forming said first plug openings.

4. The method for fabricating a semiconductor device of claim 1, wherein said second mask pattern has an alignment accuracy measuring mark with a thickness not penetrated in etching for forming said second plug openings.

* * * * *